US008362577B2

(12) United States Patent
Inaba et al.

(10) Patent No.: US 8,362,577 B2
(45) Date of Patent: *Jan. 29, 2013

(54) RESONATOR INCLUDING A MICROELECTROMECHANICAL SYSTEM STRUCTURE WITH FIRST AND SECOND STRUCTURES OF SILICON LAYERS

(75) Inventors: Shogo Inaba, Shiojiri (JP); Akira Sato, Fujimi-machi (JP); Toru Watanabe, Matsumoto (JP); Takeshi Mori, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/012,099

(22) Filed: Jan. 24, 2011

(65) Prior Publication Data

US 2011/0121908 A1 May 26, 2011

Related U.S. Application Data

(60) Division of application No. 12/684,336, filed on Jan. 8, 2010, now Pat. No. 7,892,875, which is a continuation of application No. 11/928,519, filed on Oct. 30, 2007, now Pat. No. 7,671,430.

(30) Foreign Application Priority Data

Dec. 15, 2006 (JP) ................. 2006-338042

(51) Int. Cl.
 *H01L 29/84* (2006.01)
(52) U.S. Cl. ............ 257/415; 438/50; 438/393
(58) Field of Classification Search ........... None
See application file for complete search history.

(56) References Cited

U.S. PATENT DOCUMENTS

| 5,510,637 | A | 4/1996 | Hsu et al. |
| 5,596,219 | A | 1/1997 | Hierold |
| 5,620,931 | A * | 4/1997 | Tsang et al. ........... 438/50 |
| 5,700,702 | A | 12/1997 | Klose et al. |
| 5,922,212 | A | 7/1999 | Kano et al. |
| 5,976,994 | A | 11/1999 | Nguyen et al. |
| 6,169,321 | B1 | 1/2001 | Nguyen et al. |
| 6,187,624 | B1 | 2/2001 | Huang |
| 6,531,331 | B1 | 3/2003 | Bennett et al. |
| 6,896,821 | B2 | 5/2005 | Louellet |
| 7,642,114 | B2 * | 1/2010 | Yamaguchi et al. ........ 438/50 |
| 7,671,430 | B2 * | 3/2010 | Inaba et al. ........... 257/415 |
| 7,868,403 | B1 * | 1/2011 | Ivanov et al. ........... 257/417 |
| 2005/0003606 | A1 | 1/2005 | Tilmans et al. |
| 2006/0252229 | A1 * | 11/2006 | Joly et al. ........... 438/455 |
| 2006/0270238 | A1 | 11/2006 | Izumi et al. |
| 2006/0289955 | A1 * | 12/2006 | Mitarai et al. ........ 257/415 |
| 2007/0037311 | A1 | 2/2007 | Izumi et al. |

(Continued)

FOREIGN PATENT DOCUMENTS

| JP | A-2002-505046 | 2/2002 |
| JP | A-2004-104126 | 4/2004 |

(Continued)

OTHER PUBLICATIONS

Nguyen et al., "An Integrated CMOS Micromechanical Resonator High-Q Oscillator," IEEE Journal of Solid-State Circuits, vol. 34, No. 4, Apr. 1999, pp. 440-454.

(Continued)

*Primary Examiner* — Evan Pert
*Assistant Examiner* — Andres Munoz
(74) *Attorney, Agent, or Firm* — Oliff & Berridge, PLC

(57) ABSTRACT

A resonator with a microeletromechanical system structure has a transistor with a gate electrode, a capacitor with an upper and lower electrode, a substrate, a first and second structure of the microelectromechanical system structure, a first silicon layer of the first structure and the upper electrode formed above the substrate, a second silicon layer of the second structure and the gate electrode unit formed above the substrate, and an insulating film formed above the capacitor and the transistor, the insulating film having an opening for placement of the second structure.

10 Claims, 5 Drawing Sheets

U.S. PATENT DOCUMENTS

| | | |
|---|---|---|
| 2007/0108540 A1* | 5/2007 | Cuxart .................... 257/414 |
| 2007/0224832 A1 | 9/2007 | Zurcher |
| 2008/0157897 A1 | 7/2008 | Tilmans et al. |

FOREIGN PATENT DOCUMENTS

| | | |
|---|---|---|
| JP | A-2004-526299 | 8/2004 |
| JP | A-2005-311095 | 11/2005 |
| JP | A-2006-126182 | 5/2006 |
| WO | WO 02/48668 A2 | 6/2002 |

OTHER PUBLICATIONS

Yun et al., "Surface Micromachined, Digitally Force-Balanced Accelerometer with Integrated Detection Cicuitry." IEEE 1992, pp. 126-132.

Bustillo et al., "Process technology for the modular integration of CMOS and polysilicon microstructures." Springer-Verlag 1994, pp. 30-40.

* cited by examiner

RESONATOR INCLUDING A MICROELECTROMECHANICAL SYSTEM STRUCTURE WITH FIRST AND SECOND STRUCTURES OF SILICON LAYERS

This is a Division of application Ser. No. 12/684,336 filed Jan. 8, 2010 which is a Continuation of application Ser. No. 11/928,519 filed Oct. 30, 2007, which claim priority to JP 2006-338042 filed in Japan on Dec. 15, 2006. The disclosure of the prior applications are hereby incorporated by reference herein in their entireties.

BACKGROUND

1. Technical Field

The present invention relates to a MEMS resonator and a manufacturing method of the same.

2. Related Art

In recent years, microeletromechanical systems (MEMS) have exhibited a favorable growth in the usage thereof for apparatuses such as acceleration sensors and video devices. There are various interpretations as to what MEMS include conceptually. While in some cases, it is also referred to as "micro machine", or "micro system technology (MST)", MEMS generally mean "fine functional devices produced using semiconductor manufacturing techniques". Those devices are manufactured based on fine processing techniques developed for fabrication of semiconductors. Currently, MEMS are manufactured independently from other manufacturing processes, or, produced onto an integrated circuit (IC) in a process after completing the manufacturing of IC. The field of applications of MEMS includes electric appliances and automobiles, and the field is still expanding. Processes for manufacturing MEMS have been modified based on common microfabrication techniques of semiconductors. For example, capacitive pressure sensors are known, including a diaphragm that is formed on the same semiconductor substrate concurrently to the formation of a gate of an active element. Refer to JP-A-2004-526299 as an example. Moreover, it is known that in order to make a pressure sensor which combines within a semiconductor device smaller, with the higher functionality and reliability, a conductive layer included in an electric circuit is used for forming a pressure detection unit included in a pressure sensor. Refer to JP-A-2006-126182 as an example.

In JP-A-2004-526299 however, only a static capacitive MEMS structure and a complementary metal oxide semiconductor (COMS) circuit are formed concurrently. In JP-A-2006-126182, although a MEMS structure, a COMS circuit, and an oxide-nitride-oxide (ONO) capacitor are formed on a single chip, the MEMS structure is formed in an interconnection layer, while the lower electrode of the ONO capacitor uses a diffusion layer of a silicon substrate. That is to say, the three devices (CMOS circuit, ONO capacitor, and MEMS structure) have not yet been formed concurrently, while two of the three (CMOS circuit and ONO capacitor, or, MEMS structure and CMOS circuit) have been. The above resulted in the following problems. If the ONO capacitor is not included and therefore not used, limitations are imposed on the structure (less variations) of the CMOS circuits such as analog-digital conversion circuit, and other circuits requiring capacitor other than substrate electrode. Moreover, a system in package (SIP) structure in which the ONO capacitor is packaged in a separate chip results in problems such as increased number of processes, increased cost, and noises generated by a wire bonding of interconnections. If the MEMS structure is not included, it results in the aforementioned problems such as increased noise. Further, the MEMS are processed incrementally in pre/post process. This causes an increase in the number of processes and costs, since the processing steps cannot be carried out concurrently.

SUMMARY

An advantage of the invention is to provide a method for manufacturing a MEMS resonator which simplifies processes and reduces the costs, as well as to provide a MEMS resonator produced with the method.

According to a first aspect of the invention, a method for manufacturing a MEMS resonator includes the following steps. Forming a lower electrode of an ONO capacitor unit included in the semiconductor device using a first silicon layer; forming, using a second silicon layer, a substructure of the MEMS structure unit and an upper electrode of the ONO capacitor unit included in the semiconductor device; and forming, using a third silicon layer, a superstructure of the MEMS structure unit and a gate electrode of a CMOS circuit unit included in the semiconductor device. Here, the MEMS resonator includes a semiconductor device and a MEMS structure unit that are formed on a substrate.

With the above method, the MEMS structure, the CMOS circuit, and the ONO capacitor are packaged on a single chip. This not only simplifies the process and reduces the cost but also simplifies the system and makes the system effective against noise.

According to a second aspect of the invention, a MEMS resonator includes a MEMS structure unit formed on the substrate, and a semiconductor device formed on a substrate, the semiconductor device including an ONO capacitor unit and a CMOS circuit unit.

With the above method, the MEMS structure, the CMOS circuit, and the ONO capacitor are packaged on a single chip. This not only simplifies the process and reduces the cost, but also simplifies the system and makes the system effective against noise.

In this case, the MEMS resonator may include: a first silicon layer used for forming a lower electrode included in the ONO capacitor unit; a second silicon layer used for forming a substructure included in the MEMS structure unit and an upper electrode included the ONO capacitor unit; and a third silicon layer used for forming a superstructure included in the MEMS structure unit and a gate electrode included in the CMOS circuit unit.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments in which the invention is applied will now be described with references to the accompanying drawings.

Figure 1:
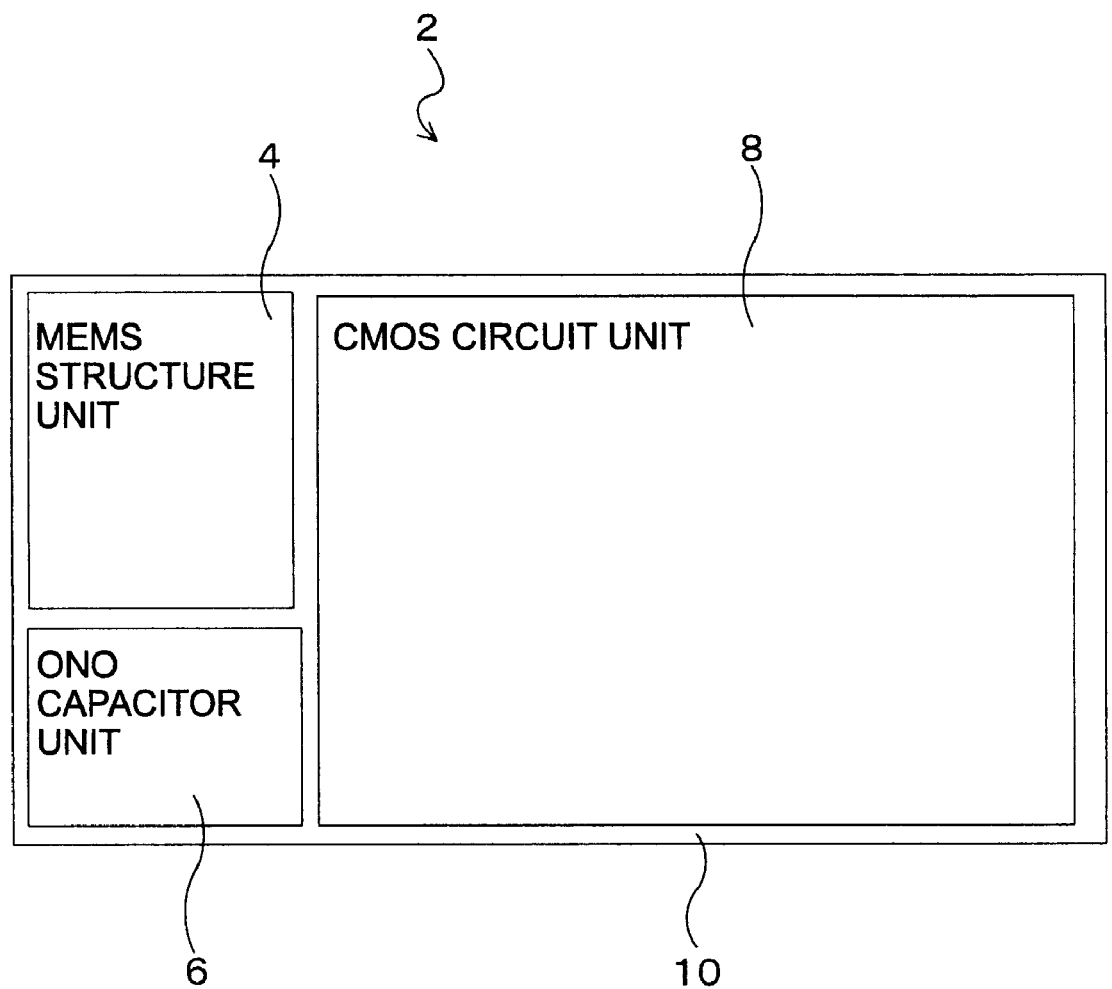
FIG. 1 is a schematic plan view illustrating a MEMS resonator according to one embodiment to which aspects of the invention are applied.
Figure 2:
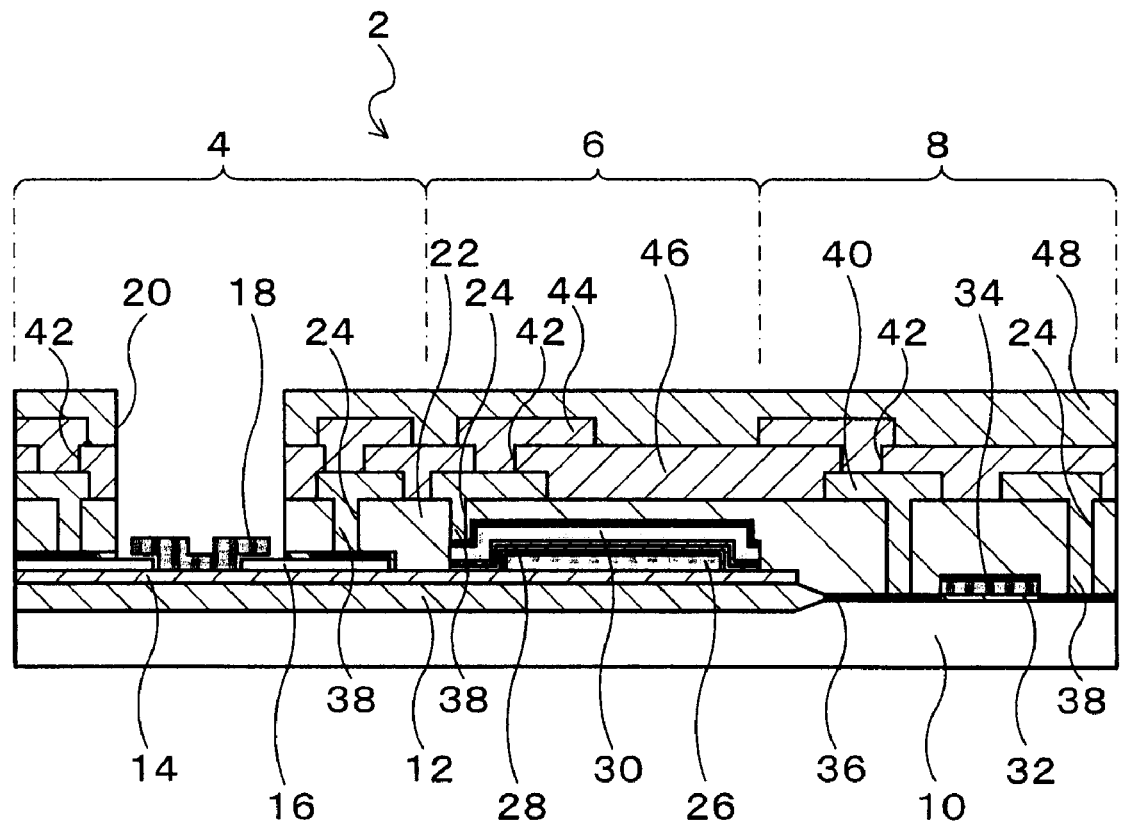
FIG. 2 is a sectional view illustrating a MEMS resonator according to one embodiment to which aspects of the invention are applied.

FIG. 1 is a schematic plan view illustrating a MEMS resonator according to one embodiment to which aspects of the invention are applied. FIG. 2 is a sectional view illustrating a MEMS resonator according to one embodiment to which aspects of the invention are applied. As shown in FIG. 1, the MEMS resonator according to one embodiment of the invention includes a substrate 10, a MEMS structure unit 4 formed on the substrate 10, and a semiconductor device including an ONO capacitor unit 6 and a CMOS circuit unit 8.

A single-crystal semiconductor substrate may be used as the substrate 10, and examples of materials includes silicon (Si) and gallium arsenide (GaAs). A silicon single-crystal substrate is particularly desirable. The thickness of the substrate 10 ranges from 100 to 1000 µm.

As shown in FIG. 2, a device isolation oxide film 12 is formed on the surface of the substrate 10. The device isolation oxide film 12 is a thermal oxidation film. The device isolation oxide film 12 is a field insulating film formed with a local oxidation of silicon (LOCOS) method, and the thickness thereof ranges from 0.1 to 2 µm. The MEMS structure unit 4 and the ONO capacitor unit 6 are arranged on the device isolation oxide film 12.

A base nitride film 14 is formed on the surface of the device isolation oxide film 12. The base nitride film 14 is a SiN film, and the thickness thereof ranges from 0.1 to 2 µm. The base nitride film 14 is needed under the MEMS structure unit 4, and may also be under the ONO capacitor unit 6.

A substructure 16 and a superstructure 18, both included in the MEMS structure unit 4, are formed on the surface of the base nitride film 14 in a region of the MEMS structure unit 4. In one embodiment, the substructure 16 and the superstructure 18 are both in direct contact with and arranged directly on the base nitride film 14. The substructure 16 in the MEMS structure unit 4 is formed using a second silicon layer 52 (refer to FIG. 4A). The substructure 16 in the MEMS structure unit 4 and an upper electrode 30 of the ONO capacitor unit 6 are formed simultaneously using the second silicon layer 52. The superstructure 18 in the MEMS structure unit 4 is formed using a third silicon layer 54 (refer to FIG. 4C). The superstructure 18 in the MEMS structure unit 4 and a gate electrode 34 of the CMOS circuit unit 8 are formed simultaneously using the third silicon layer 54. Examples of materials used in the substructure 16 of the MEMS structure unit 4 include polycrystalline silicon (poly-Si) and amorphous silicon. The thickness of the substructure 16 of the MEMS structure unit 4 ranges from 0.05 to 100 µm. Examples of materials used in the superstructure 18 of the MEMS structure unit 4 include polycrystalline silicon (poly-Si) and amorphous silicon. The thickness of the superstructure 18 of the MEMS structure unit 4 ranges from 0.05 to 100 µm.

A second field interlayer film 22 is formed over the substructure 16 of the MEMS structure unit 4, and contact holes 24 are formed over the substructures 16 in the MEMS structure unit 4.

A lower electrode 26 of the ONO capacitor unit 6 is formed on the surface of the base nitride film 14 in a region of the ONO capacitor unit 6. The lower electrode 26 of the ONO capacitor unit 6 is formed using a first silicon layer 26 (refer to FIG. 3A). Examples of materials used in the lower electrode 26 of the ONO capacitor unit 6 include Poly-Si and amorphous Si. The thickness of the lower electrode 26 of the ONO capacitor unit 6 ranges from 0.05 to 100 µm.

An ONO capacitor interlayer insulating film 28 is formed on the lower electrode 26 of the ONO capacitor unit 6. The ONO capacitor interlayer insulating film 28 is formed including therein three layers; a lower interlayer insulating film 28A, an intermediate interlayer insulating film 28B, and an upper interlayer insulating film 28C (refer to FIG. 3D). Materials used for the ONO capacitor interlayer insulating film 28 are $SiO_2$, $Si_3N_4$, and $SiO_2$ for the lower interlayer insulating film 28A, the intermediate interlayer insulating film 28B, and the upper interlayer insulating film 28C respectively. The thickness of all the above three layers constituting the ONO capacitor interlayer insulating film 28 ranges from 1 to 50 nm.

The upper electrode 30 of the ONO capacitor unit 6 is formed on the ONO capacitor interlayer insulating film 28. The upper electrode 30 of the ONO capacitor unit 6 is formed using the second silicon layer 52 (refer to FIG. 4A). The upper electrode 30 of the ONO capacitor unit 6 and the substructure 16 in the MEMS structure unit 4 are formed simultaneously using the second silicon layer 52. Examples of materials used in the upper electrode 30 of the ONO capacitor unit 6 include Poly-Si and amorphous Si. The thickness of the upper electrode 30 of the ONO capacitor unit 6 ranges from 0.05 to 100 µm.

The second field interlayer film 22 is formed over the upper electrode 30 of the ONO capacitor unit 6. One of the contact holes 24 is formed over the upper electrode 30 of the ONO capacitor unit 6.

A transistor which has elements such as a gate oxide film 32 and the gate electrode 34 is formed on the surface of the substrate 10 in a region of the CMOS circuit unit 8. The gate electrode 34 of the CMOS circuit unit 8 is formed using the third silicon layer 54 (refer to FIG. 4C). The superstructure 18 in the MEMS structure unit 4 and the gate electrode 34 of the CMOS circuit unit 8 are formed simultaneously using the third silicon layer 54. Examples of materials used in the gate electrode 34 of the CMOS circuit unit 8 include Poly-Si and amorphous Si. The thickness of the gate electrode 34 of the CMOS circuit unit 8 ranges from 0.05 to 100 µm.

The second field interlayer film 22 is formed over the CMOS circuit unit 8. The contact holes 24 are formed on a diffusion layer (source and drain) 36 of the CMOS circuit unit 8.

Plugs 38 made from a titanium nitride film and a tungsten film are formed inside the contact holes 24 formed in the regions 4, 6, and 8.

A first metal wiring layer 40 connected to the plugs 38 is formed on the surface of the second field interlayer film 22. Examples of materials used in the first metal wiring layer 40 are Al, Cu, Ti, TiN, and W. The thickness of the first metal wiring layer 40 ranges from 0.1 to 3 µm.

A second metal wiring layer 44 are formed on first metal wiring layer 40, being coupled with the first metal wiring layer 40 through via holes 42. Examples of materials used in the second metal wiring layer 44 include Al, Cu, Ti, TiN, and W. The thickness of the second metal wiring layer 44 ranges from 0.1 to 3 µm. The first metal wiring layer 40 and the second metal wiring layer 44 are insulated from each other with a wiring layer interlaminate film 46 made of silicon oxides. The wiring layer interlaminate film 46 is, for instance, a CVD oxide film, and the thickness thereof ranges from 0.2 to 1 µm. Chemical mechanical polishing (CMP) is used as necessary during the manufacturing of a semiconductor device in this embodiment. Therefore, the first metal wiring layer 40 and the second metal wiring layer 44 are formed to be approximately flat.

A passivation film 48 is formed on the surface of the second metal wiring layer 44. Examples of the passivation film 48 include a CVD oxide film, a CVD-SiN film, and a polyimide film. The thicknesses of the passivation film 48 are 0.1-2 µm, 0.1-5 µm, and 0.5-20 µm for an oxide film, a nitride film, and polyimide film respectively.

An opening 20 in the MEMS structure unit 4 approximately corresponds to a region that includes a movable portion of the superstructure 18 and a part of the substructure 16, and is opened in a way to ensure the prescribed gap between the substructure 16 and the superstructure 18.

According to this embodiment, a MEMS structure, a CMOS circuit, and an ONO capacitor are packaged into a single chip. This not only simplifies the process and reduces the cost, but also simplifies the system and makes the system effective against noise.

Examples of applications of the MEMS structure unit 4 include a switch, an acceleration sensor, and an actuator. Examples of applications of the CMOS circuit unit 8 include a temperature sensor for temperature compensation, an analog-digital conversion circuit, a logic circuit, a clock, and an analog-digital combined circuit such as power control circuit.

A manufacturing method of a MEMS resonator according to one embodiment to which one aspect of the invention is applied will now be described with references to the accompanying drawings.

Figure 3A:
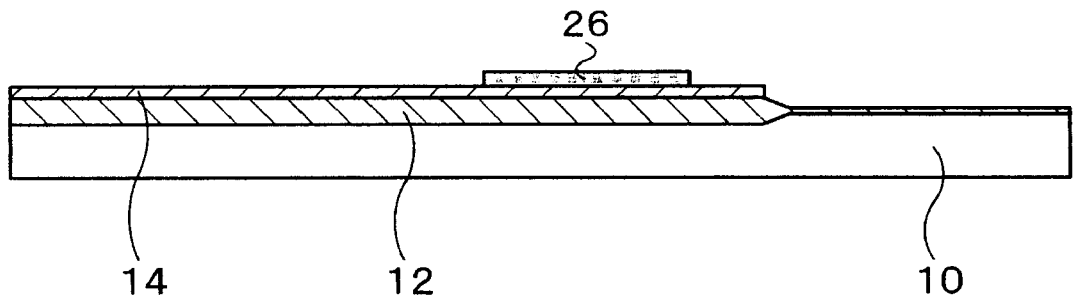
FIGS. 3A to 3D are drawings for describing a manufacturing method of the MEMS resonator according to one embodiment to which an aspect of the invention is applied.

FIGS. 3A to 5B are drawings for describing the manufacturing method of the MEMS resonator according to one embodiment to which one aspect of the invention is applied. As shown in FIG. 3A, the first silicon layer 26 is first formed according to this manufacturing method of the MEMS resonator. Specifically, after forming the device isolation oxide film 12 such as Locos or trench film on the substrate 10, a first silicon nitride film 14 is formed, so as to serve as an anchor during a release etch process. The first silicon nitride film 14 is the base nitride film 14 (refer to FIG. 2). Thereafter, the first silicon layer 26 is formed on the first silicon nitride film 14. Examples of materials used in the first silicon layer 26 include Poly-Si and amorphous Si. The thickness of the first silicon layer 26 ranges from 0.05 to 100 µm. The first silicon layer 26 is the lower electrode 26 of the ONO capacitor unit 6 (refer to FIG. 2). The lower electrode 26 of the ONO capacitor unit 6 is formed by using the first silicon layer 26.

Figure 3B:
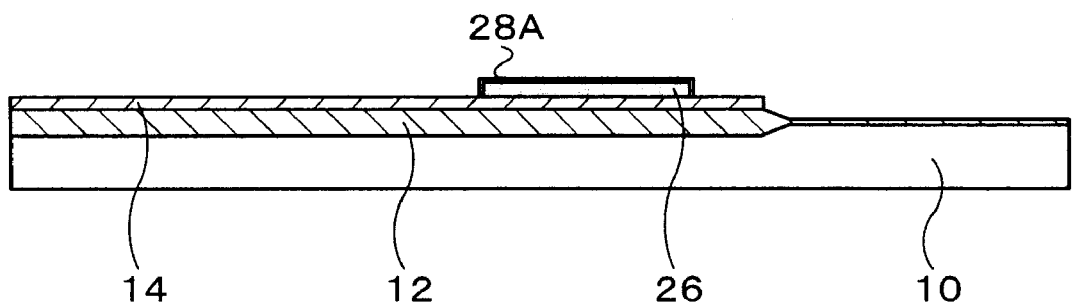

Subsequently, the lower interlayer insulating film 28A is formed, as shown in FIG. 3B, by oxidizing the surface of the lower electrode 26. Here, the lower interlayer insulating film 28A is included in the ONO capacitor interlayer insulating film 28 of the ONO capacitor unit 6 (refer to FIG. 2).

Figure 3C:
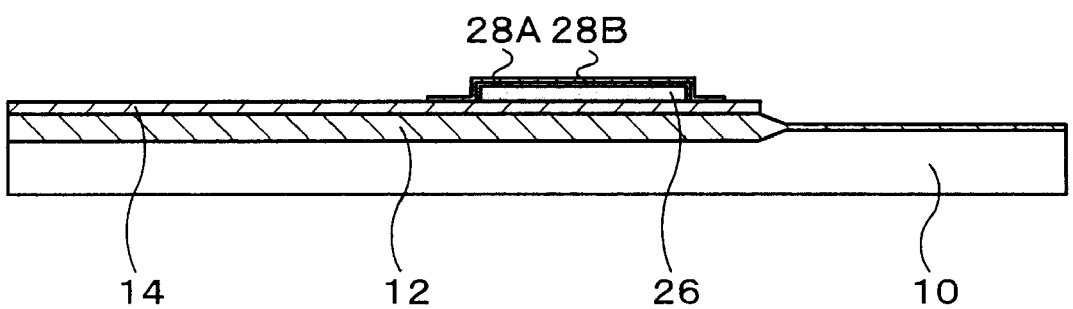
Figure 3D:
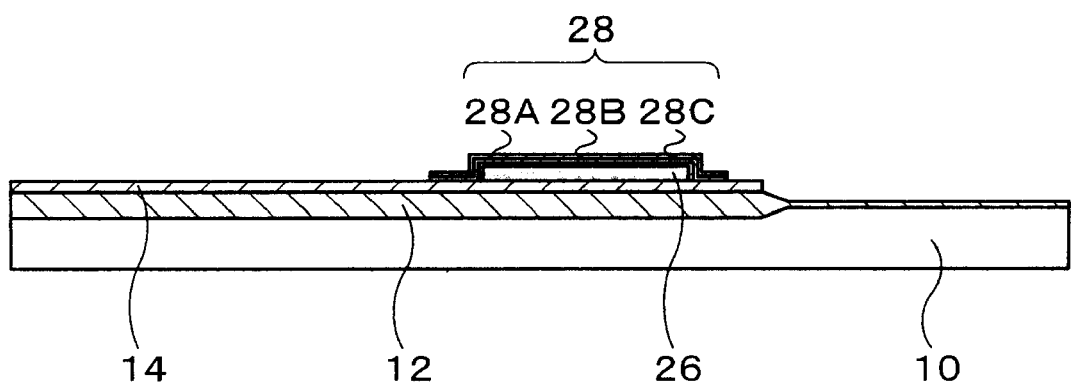

Thereafter, as shown in FIG. 3C, a second silicon nitride film 28B is formed. Specifically, it is formed on the lower interlayer insulating film 28A and on part of the base nitride film 14. The second silicone nitride film 28B becomes the interlayer insulating film 28B. The intermediate interlayer insulating film 28B is one of the layers that constitute the ONO capacitor interlayer insulating film 28.

Subsequently, the upper interlayer insulating film 28C is formed as shown in FIG. 3C. Specifically, it is formed by oxidizing the surface of the intermediate interlayer insulating film 28B. The upper interlayer insulating film 28C is one of the layers that constitute the ONO capacitor interlayer insulating film 28.

Figure 4A:
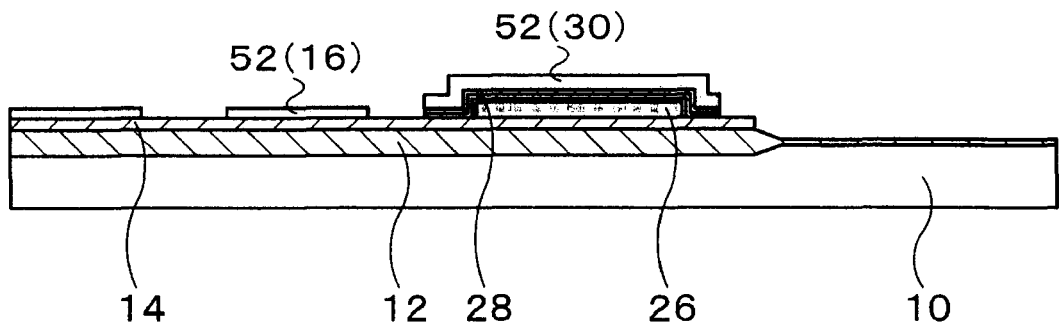
FIGS. 4A to 4D are drawings for describing the manufacturing method of the MEMS resonator according to one embodiment to which an aspect of the invention is applied.

Thereafter, the second silicon layer 52 is formed as shown in FIG. 4A. Specifically, it is formed on the base nitride film 14 and on the upper interlayer insulating film 28C. Examples of materials used in the second silicon layer 52 include Poly-Si and amorphous Si. The thickness of the second silicon layer 52 ranges from 0.05 to 100 µm. The second silicon layer 52 may undergo doping. Examples of doping include ion implantation and thermal diffusion. The second silicon layer 52 becomes the substructure 16 in the MEMS structure unit 4 (refer to FIG. 2), as well as the upper electrode 30 of the ONO capacitor unit 6. The substructure 16 in the MEMS structure unit 4 and the upper electrode 30 of the ONO capacitor unit 6 are formed simultaneously by using the second silicon layer 52.

According to this embodiment, sharing the layers prevents the number of processes to increase, thereby enabling the simultaneous formation.

Figure 4B:
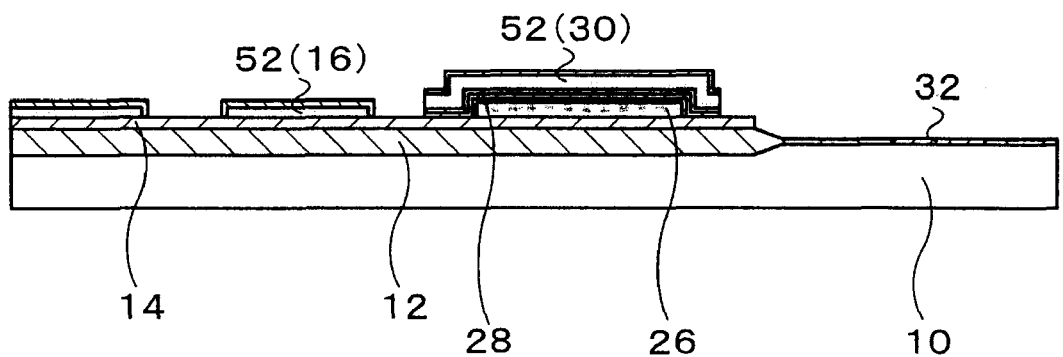

Subsequently, the gate oxide film 32 is formed as shown in FIG. 4B. Specifically, the oxidized films formed up to this point are stripped and newly oxidized again. The surface of the second silicon layer 52 is oxidized concurrently with the formation of the gate oxide film 32. Oxidizing the surface of the second silicon layer 52 results in the oxidation of the substructure 16 in the MEMS structure unit 4 and the upper electrode 30 of the ONO capacitor unit 6. The oxidation of the surface of the substructure 16 in the MEMS structure unit 4 creates the thickness of the gap included in the MEMS structure unit 4. The oxidation process may be carried out for a plurality of times as necessary, in order to prepare gate oxide films for different uses such as one for a low voltage and another for a high voltage. In this case, a second gate oxidation of the CMOS circuit unit 8 and a subsequent oxidation of the CMOS circuit unit 8 after the second one have a dual purpose to oxidize the gap of the MEMS structure unit 4. The process for forming the tunnel oxide films such as EEPROM tunnel oxides may also be carried out at the same time. Not only the aforementioned processes for silicon film deposition but also lithography processes are also carried out concurrently.

According to this embodiment, sharing the layers prevents the number of processes to increase, thereby enabling the simultaneous formation.

Figure 4C:
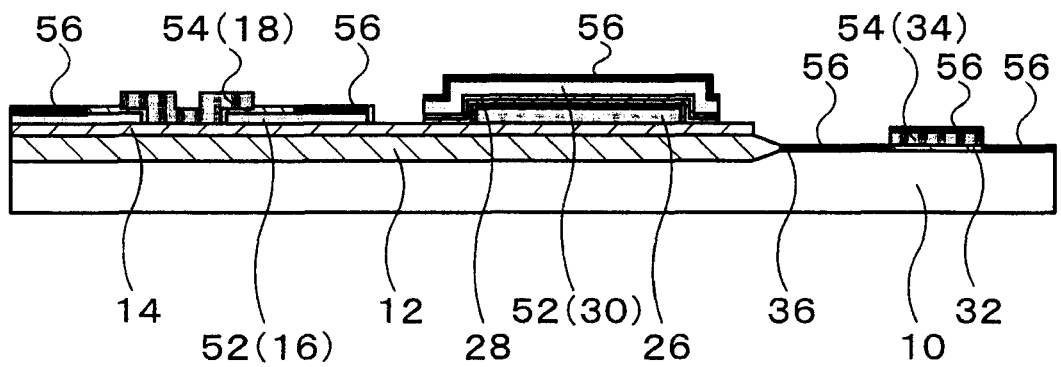

Thereafter, the third silicon layer 54 is formed as shown in FIG. 4C. Specifically, it is formed on the gate oxide film 32 of the CMOS circuit unit 8 (refer to FIG. 2), the upper electrode 30 of the ONO capacitor unit 6, and the substructure 16 in the MEMS structure unit 4. Examples of materials used in the third silicon layer 54 include Poly-Si and amorphous Si. The thickness of the third silicon layer 54 ranges from 0.05 to 100 µm. The third silicon layer 54 becomes superstructure 18 in the MEMS structure unit 4, and the gate electrode 34 of the CMOS circuit unit 8. The substructure 18 and the upper electrode 34 are formed simultaneously by using the third silicon layer 54.

According to this embodiment, sharing the layers prevents the number of processes to increase, thereby enabling the simultaneous formation.

Figure 4D:
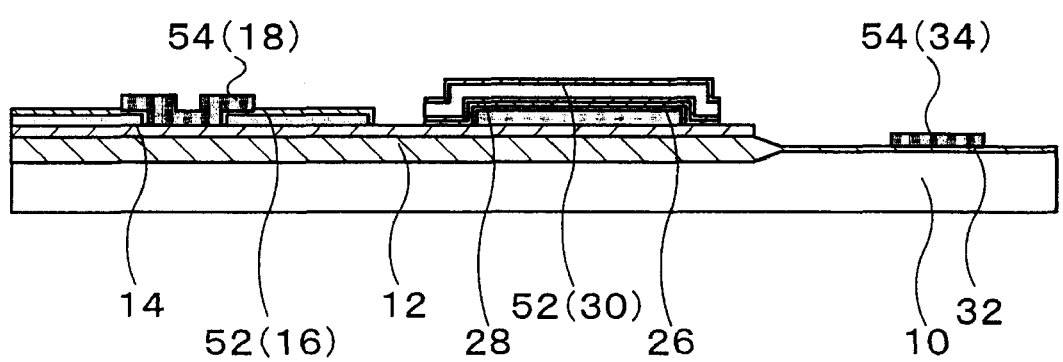

Subsequently, a self-aligned silicide (salicide) region 56 is formed as shown in FIG. 4D. Specifically, the oxide film is removed selectively in regions for salication (portions for interconnection). Ti is then deposited on the entire surface so as to undergo heat treatment. As a result, the portions where the oxide film is removed become silicide by a salicidation process. Alternatively, usage of silicides that can withstand release etching may allow salicidation of the entire substrate after depositing the third silicon layer 54. Ti regions that did not become silicide by a salicidation process are removed with RCA cleaning. Examples of materials used in the salicide region 56 are Ti, W, Mo, Co, Ni, Ta, Pt, and Pd. The thickness of the salicide region 56 ranges from 0.01 to 1 µm.

As described, in the method for manufacturing a MEMS resonator according to this embodiment, resistance of silicon layers may be reduced by carrying out impurity implantation (or thermal diffusion), or by silicidation. However, the silicidation is optional in the MEMS structure unit 4. Silicidation is carried out, for instance, if the material dissolves in the release process.

Figure 5A:
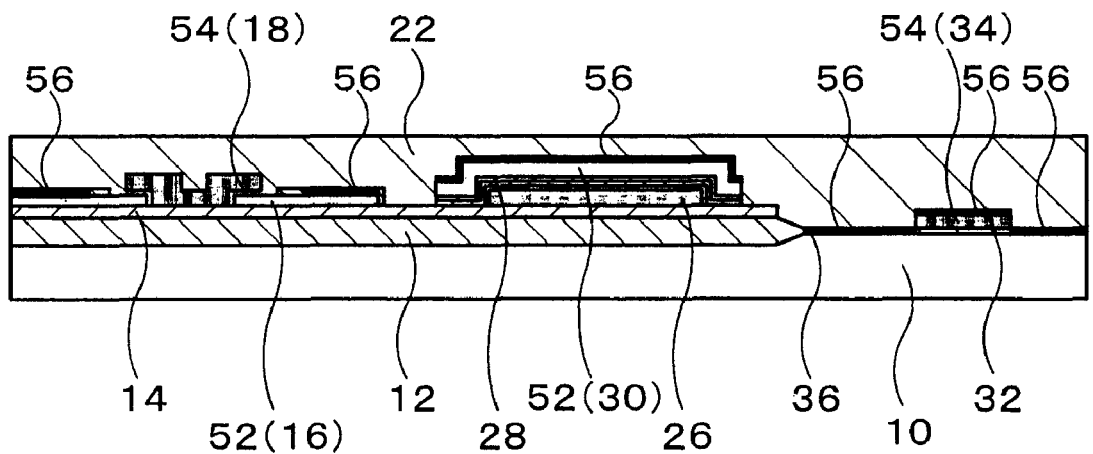
FIGS. 5A and 5B are drawings for describing the manufacturing method of the MEMS resonator according to one embodiment to which an aspect of the invention is applied.

Thereafter, the second field interlayer film 22 is formed as shown in FIG. 5A. Specifically, it is formed over the substructure 16 in the MEMS structure unit 4, the upper electrode 30 of the ONO capacitor unit 6, and the CMOS circuit unit 8. Materials used for the thin film deposition and fabrication include low temperature oxide (LTO), high temperature oxide (HTO), phospho silicate glass (PSG), boruphosphosilieate glass (BPSG), and spin-on-glass (SOG). Therefore, the second field interlayer film 22 is formed to be approximately flat.

Figure 5B:
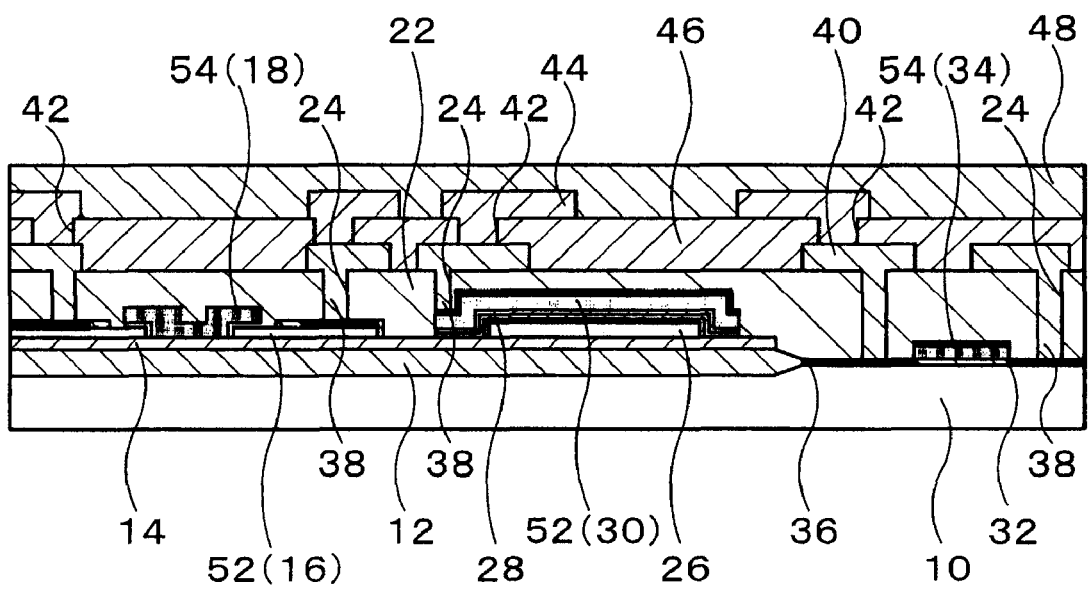

As shown in FIG. 5B, the first metal wiring layer 40, the wiring layer interlaminate film 46, the second metal wiring layer 44, and the passivation film 48 are formed. First, the contact holes 24 are formed over the substructure 16 in the MEMS structure unit 4, the upper electrode 30 of the ONO capacitor unit 6, and on the diffusion layer (source and drain) 36 of the CMOS circuit unit 8. The plugs 38 are formed inside the contact holes 24, touching the surface of the salicide regions. The first metal wiring layer 40 coupled with the plugs 38 is formed on the surface of the second field interlayer film 22. The second metal wiring layer 44 coupled with the first metal wiring layer 40 through via holes 42 is formed on the first metal wiring layer 40. The first metal wiring layer 40 and the second metal wiring layer 44 are formed so as to be insulated from each other with the wiring layer interlaminate film 46. Chemical mechanical polishing (CMP) is used as necessary during the manufacturing of a semiconductor device in this embodiment. Therefore, the first metal wiring layer 40 and the second metal wiring layer 44 are formed to be approximately flat. A plurality of wiring layers may be formed. The passivation film 48 is formed on the surface of the second metal wiring layer 44.

Subsequently, as shown in FIG. 2, release etching is carried out. Prior to release etching, regions except for the MEMS structure are protected by etching-resistant organic films such as resist and polyimide films.

According to this embodiment, the MEMS structure unit 4, the ONO capacitor unit 6, and the CMOS circuit unit 8 are formed simultanously in the process in which the MEMS structure are formed on a silicon substrate surface together with semiconductor devices such as transistors. Here, the MEMS structure unit 4, the gate electrode 34 of the CMOS circuit unit 8, the lower electrodes 26 and 30 in the ONO capacitor unit 6 are all composed with silicon deposited layers. By concurrently carrying out the process of forming the electrodes or interlayer insulating films for the MEMS structure unit 4, the ONO capacitor unit 6, and the CMOS circuit unit 8, a workflow for effective production is set up without significantly increasing the number of processes. Therefore, these three devices are produced on a single chip without causing problems in any of them. Mounting the ONO capacitor unit 6 on the chip that includes the MEMS structure unit 4 and the CMOS circuit unit 8 broadens the designing variations of the CMOS circuit unit 8. The CMOS circuit unit 8 may serve as devices such as a detector, an amplifier, an operator, and an AD converter, thereby enhancing the convenience of products.

According to this embodiment, a MEMS structure, a CMOS circuit, and an ONO capacitor are packaged into a single chip. This not only simplifies the process and reduces the cost, but also simplifies the system and makes the system effective against noise.

This embodiment can be applied to products in which a MEMS structure unit and semiconductor devices such as CMOS and ONO capacitor are packaged in a single chip, the MEMS structure unit being made of silicon materials. The fields of application of the MEMS structure units include sensors, radio frequency system, switches, and imaging.

The entire disclosure of Japanese Patent Application No. 2006-338042, filed Dec. 15, 2006 is expressly incorporated by reference herein.

What is claimed is:

1. A resonator comprising:
   a substrate;
   a transistor with a gate electrode;
   a capacitor with a lower electrode and an upper electrode; and
   a microelectromechanical system structure with a first structure and a second structure,
   wherein the first structure of the microelectromechanical system structure and the upper electrode of the capacitor are formed from a common second silicon layer,
   the first and second structures do not entirely overlap each other, and
   the first and second structures are both in direct contact with and arranged directly on and adjacent to only one side of at least one of a same film layer.

2. The resonator according to claim 1, wherein the capacitor comprises an oxide-nitride-oxide interlayer insulating film.

3. The resonator according to claim 1, wherein the transistor is a Complementary Metal Oxide Semiconductor (CMOS) transistor.

4. The resonator according to claim 1, wherein the second structure of the microelectromechanical system structure includes a movable portion.

5. The resonator according to claim 1, further comprising an interlayer film.

6. The resonator according to claim 1, wherein the second structure of the microelectromechanical system structure and the gate electrode of the transistor are formed from a common third silicon layer.

7. The resonator according to claim 6, wherein the lower electrode of the capacitor is formed of a first silicon layer.

8. The resonator according to claim 1, the resonator comprising a salicide region formed above the capacitor and the transistor, the salicide region having an opening where the second structure of the microelectromechanical system structure is placed.

9. The resonator according to claim 1, wherein the microelectromechanical system structure is a switch, an acceleration sensor or an actuator.

10. The resonator according to claim 1, wherein the second structure of the microelectromechanical system structure is T-shaped in a cross-sectional view.

* * * * *